USOO6353362B1

(12) United States Patent
Corsi et al.

(10) Patent No.: US 6,353,362 B1
(45) Date of Patent: Mar. 5, 2002

(54) RESONANCE FREE COMPLEMENTARY BIPOLAR OUTPUT STAGE

(75) Inventors: Marco Corsi, Allen, TX (US); Stephen W. Milam, Greensboro, NC (US); Neil Gibson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/705,468

(22) Filed: Nov. 3, 2000

Related U.S. Application Data

(60) Provisional application No. 60/167,187, filed on Nov. 23, 1999.

(51) Int. Cl.[7] ................................................. H03F 3/18
(52) U.S. Cl. ....................................... 330/263; 330/267
(58) Field of Search ................................. 330/263, 267, 330/268, 292

(56) References Cited

U.S. PATENT DOCUMENTS

| | | | | |
|---|---|---|---|---|
| 4,827,223 A | * | 5/1989 | Gross | 330/267 |
| 5,302,917 A | * | 4/1994 | Concorso | 330/267 |
| 5,578,966 A | * | 11/1996 | Mills | 330/263 |
| 6,054,898 A | * | 4/2000 | Okuma et al. | 330/267 |

* cited by examiner

*Primary Examiner*—Robert Pascal
*Assistant Examiner*—Khanh V. Nguyen
(74) *Attorney, Agent, or Firm*—Alan K. Stewart; Wade James Brady, III; Frederick J. Telecky, Jr.

(57) ABSTRACT

An output stage of a complementary bipolar operational amplifier includes: a first bipolar transistor 14; a second bipolar transistor 16 coupled to the first bipolar transistor 14; a third bipolar transistor 10; a fourth bipolar transistor 12; a first resistor 42 coupled between a base of the first bipolar transistor 14 and the third bipolar transistor 10; a second resistor 43 coupled between a base of the second bipolar transistor 16 and the fourth bipolar transistor 12; a first current source 26; a second current source 28; a third resistor 40 coupled between the first current source 26 and the third transistor 10; a fourth resistor 41 coupled between the second current source 28 and the fourth transistor 12; a fifth resistor 19 coupled between a base of the third transistor 10 and a common node; a sixth resistor 18 coupled between a base of the fourth transistor 12 and the common node; a first input stage current source 24 coupled to the base of the third transistor 10; and a second input stage current source 22 coupled to the base of the fourth transistor 12.

4 Claims, 1 Drawing Sheet

RESONANCE FREE COMPLEMENTARY BIPOLAR OUTPUT STAGE

This application claims priority under 35 USC § 119 (e)(1) of provisional application No. 60/167,187 filed Nov. 23, 1999.

FIELD OF THE INVENTION

This invention generally relates to electronic systems and in particular it relates to complementary bipolar operational amplifiers.

BACKGROUND OF THE INVENTION

Resistors needed in the output stage to reduce resonances caused by emitter followers driving capacitive loads cause the current in the output stage to rise quiescently. The prior art output stage circuit of FIG. 1 shows such an output state. The prior art circuit of FIG. 1 includes transistors 10, 12, 14, and 16; resistors 18–21; current sources 22, 24, 26, and 28; capacitor 30; positive power supply node 32; negative power supply node 34; output node 36; and ground node 38. Current sources 22 and 24 each represents a signal dependent current from the input stage of a complementary bipolar operational amplifier. Current sources 22 and 24 provide the DC bias and the input signal to the circuit. Resistors 20 and 21 are needed to damp out the resonance formed by the emitter tuned inductance of transistors 10 and 12 and the base collector capacitances of transistors 14 and 16 and the capacitances of current sources 26 and 28. To counteract the effect of these resistors on the DC quiescent current, resistors 18 and 19 are added to subtract some voltage from between the bases of transistors 14 and 16. Resistors 18 and 19 need to be large enough to cause asymmetric phase delays from the gain node to the output. This generates additional stability problems that can lead to the output stage oscillating on its own.

SUMMARY OF THE INVENTION

Generally, and in one form of the invention, the output stage of a complementary bipolar operational amplifier includes: a first bipolar transistor; a second bipolar transistor coupled to the first bipolar transistor; a third bipolar transistor; a fourth bipolar transistor; a first resistor coupled between a base of the first bipolar transistor and the third bipolar transistor; a second resistor coupled between a base of the second bipolar transistor and the fourth bipolar transistor; a first current source; a second current source; a third resistor coupled between the first current source and the third transistor; a fourth resistor coupled between the second current source and the fourth transistor; a fifth resistor coupled between a base of the third transistor and a common node; a sixth resistor coupled between a base of the fourth transistor and the common node; a first input stage current source coupled to the base of the third transistor; and a second input stage current source coupled to the base of the fourth transistor.

DETAILED DESCRIPTION OF PREFERRED EMBODIMENTS

Figure 1:
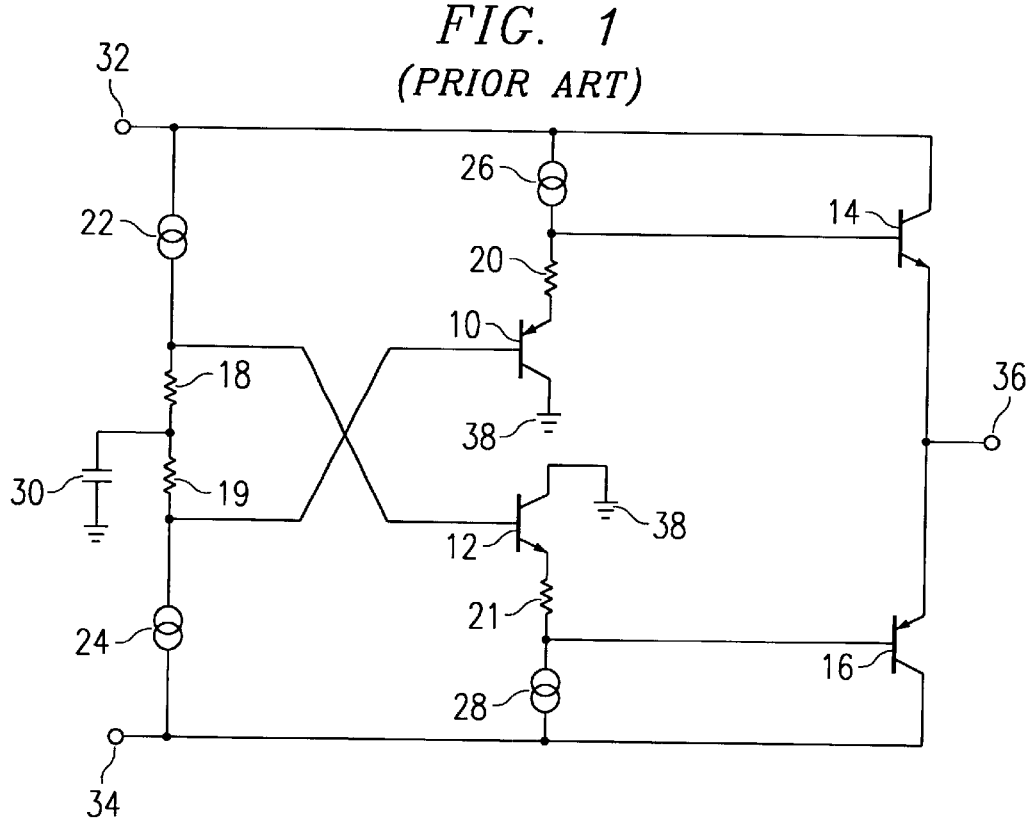
FIG. 1 is a schematic circuit diagram of a prior art output stage of a bipolar operational amplifier.
Figure 2:
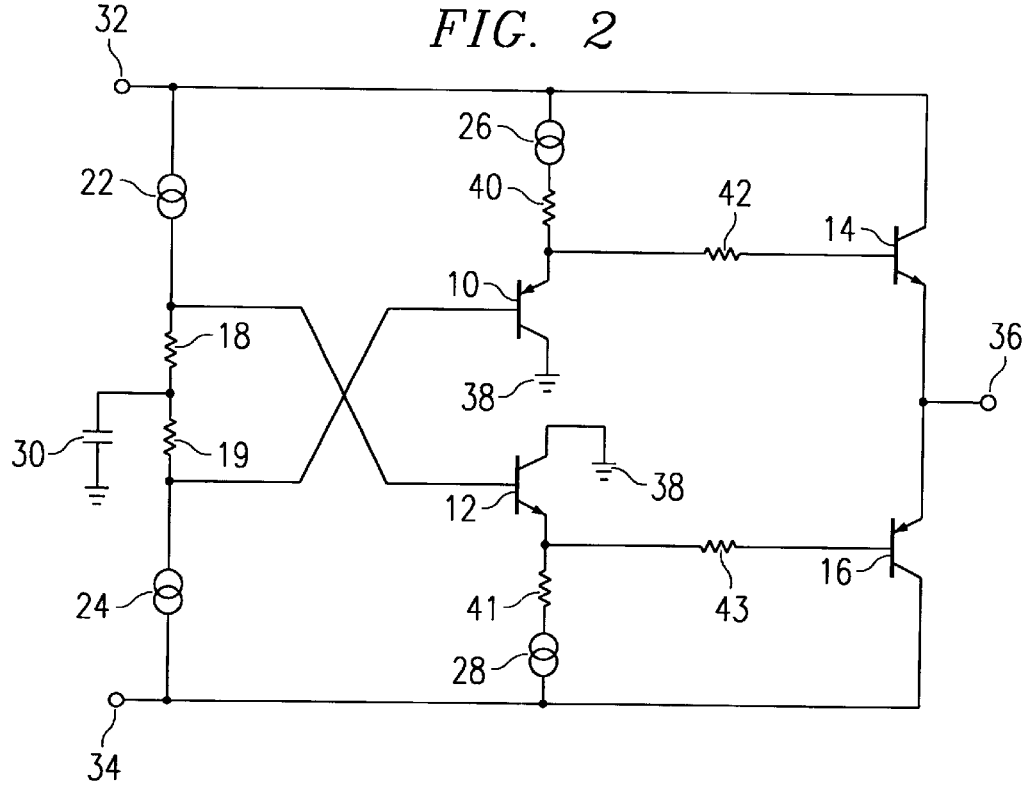
FIG. 2 is a schematic circuit diagram of a preferred embodiment output stage of a bipolar operational amplifier.

Referring to FIG. 2, a circuit diagram of a preferred embodiment output stage of a complementary bipolar operational amplifier is illustrated. The circuit of FIG. 2 includes transistors 10, 12, 14, and 16; resistors 18 and 19; current sources 22, 24, 26, and 28; capacitor 30; positive power supply node 32; negative power supply node 34; output node 36; ground node 38; and resistors 40–43. The preferred embodiment splits resistors 20 and 21 of the prior art circuit into four resistors 40–43. Resistors 40–43 isolate the capacitance of the base. collector junctions of the output transistors 14 and 16 and the current sources 26 and 28 separately without appearing in the DC equations that set the operating quiescent current. This allows resistors 18 and 19 to be smaller, reducing the effect of these resistors on the asymmetric phase delays through the output.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. An output stage of a complementary bipolar operational amplifier comprising:

a first bipolar transistor;

a second bipolar transistor coupled to the first bipolar transistor;

a third bipolar transistor;

a fourth bipolar transistor;

a first resistor coupled between a base of the first bipolar transistor and the third bipolar transistor;

a second resistor coupled between a base of the second bipolar transistor and the fourth bipolar transistor;

a first current source;

a second current source;

a third resistor coupled between the first current source and the third transistor;

a fourth resistor coupled between the second current source and the fourth transistor;

a fifth resistor coupled between a base of the third transistor and a common node;

a sixth resistor coupled between a base of the fourth transistor and the common node;

a first input stage current source coupled to the base of the third transistor; and a second input stage current source coupled to the base of the fourth transistor.

2. The circuit of claim 1 further comprising a capacitor coupled to the common node.

3. The circuit of claim 1 wherein the first and fourth transistors are NPN transistors.

4. The circuit of claim 1 wherein the second and third transistors are PNP transistors.

* * * * *